(12) United States Patent
Horiuchi

(10) Patent No.: US 7,821,806 B2
(45) Date of Patent: Oct. 26, 2010

(54) NONVOLATILE SEMICONDUCTOR MEMORY CIRCUIT UTILIZING A MIS TRANSISTOR AS A MEMORY CELL

(75) Inventor: Tadahiko Horiuchi, Isehara (JP)

(73) Assignee: Nscore Inc., Fukuoka (JP)

( * ) Notice: Subject to any disclaimer, the term of this patent is extended or adjusted under 35 U.S.C. 154(b) by 370 days.

(21) Appl. No.: 12/141,231

(22) Filed: Jun. 18, 2008

(65) Prior Publication Data

US 2009/0316477 A1 Dec. 24, 2009

(51) Int. Cl.
*G11C 17/12* (2006.01)

(52) U.S. Cl. .............. 365/104; 365/103; 365/154; 365/190; 365/189.05; 365/189.07

(58) Field of Classification Search ........... 365/156, 365/154, 190, 182, 174, 189.05, 189.07, 365/104, 103
See application file for complete search history.

(56) References Cited

U.S. PATENT DOCUMENTS

| | | | |
|---|---|---|---|
| 3,636,530 | A | 1/1972 | Mark et al. |
| 4,419,744 | A | 12/1983 | Rutter |
| 5,956,269 | A | 9/1999 | Ouyang et al. |
| 6,038,168 | A | 3/2000 | Allen et al. |
| 6,064,590 | A | 5/2000 | Han et al. |
| 6,740,927 | B1 | 5/2004 | Jeng |
| 6,906,953 | B2 | 6/2005 | Forbes et al. |
| 6,906,962 | B2 | 6/2005 | Layman et al. |
| 6,909,635 | B2 | 6/2005 | Forbes et al. |
| 7,227,234 | B2 | 6/2007 | Roizon et al. |
| 7,733,714 | B2 * | 6/2010 | Horiuchi et al. ........ 365/189.12 |
| 2004/0232477 | A1 | 11/2004 | Iwata et al. |
| 2004/0252554 | A1 | 12/2004 | Fournel et al. |
| 2009/0310428 | A1 * | 12/2009 | Horiuchi et al. ........ 365/189.05 |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | WO2004/057621 | 7/2004 |
| WO | WO2006/093629 | 9/2006 |

* cited by examiner

*Primary Examiner*—Andrew Q Tran
(74) *Attorney, Agent, or Firm*—IPUSA, PLLC

(57) ABSTRACT

A memory circuit includes a latch having a first node and a second node to store data such that a logic level of the first node is an inverse of a logic level of the second node, a MIS transistor having a gate node, a first source/drain node, and a second source/drain node, the first source/drain node coupled to the first node of the latch, and a control circuit configured to control the gate node and second source/drain node of the MIS transistor in a first operation such that a lingering change is created in transistor characteristics of the MIS transistor in response to the data stored in the latch, wherein the MIS transistor includes a highly-doped substrate layer, a lightly-doped substrate layer disposed on the highly-doped substrate layer, diffusion regions formed in the lightly-doped substrate layer, a gate electrode, sidewalls, and an insulating film.

8 Claims, 10 Drawing Sheets

NONVOLATILE SEMICONDUCTOR MEMORY CIRCUIT UTILIZING A MIS TRANSISTOR AS A MEMORY CELL

BACKGROUND OF THE INVENTION

1. Field of the Invention

The disclosures herein generally relate to a memory circuit, and particularly relate to a nonvolatile memory circuit which is capable of retaining stored data in the absence of a power supply voltage.

2. Description of the Related Art

Nonvolatile semiconductor memory devices, which can retain stored data even when power is turned off, conventionally include flash EEPROM employing a floating gate structure, FeRAM employing a ferroelectric film, MRAMs employing a ferromagnetic film, etc. There is a new type of nonvolatile semiconductor memory device called PermSRAM. PermSRAM uses a MIS (metal-insulating film-semiconductor) transistor as a nonvolatile memory cell (i.e., the basic unit of data storage). The MIS transistor used as a nonvolatile memory cell in PermSRAM has the same structure as ordinary MIS transistors used for conventional transistor functions (e.g., switching function), and do not require a special structure such as a floating gate or a special material such as a ferroelectric material or ferromagnetic material. The absence of such a special structure and special material offers an advantage in cost reduction. PermSRAM was initially disclosed in PCT/JP2003/016143, which was filed on Dec. 17, 2003, the entire contents of which are hereby incorporated by reference.

The MIS transistor used as a nonvolatile memory cell in PermSRAM is configured to experience an irreversible hot-carrier effect on purpose for storage of one-bit data. Here, the irreversible hot-carrier effect refers to the injection of electrons into the oxide film and/or sidewalls. A change in the transistor characteristics caused by a hot-carrier effect represents one-bit data "0" or "1". Such a change may be detected by sensing a difference in ON current between the nonvolatile-memory-cell MIS transistor and a reference MIS transistor by using a sensing circuit such as a latch circuit.

Data supplied from an external source to a PermSRAM are initially written to the latch circuit. After the writing of data to the latch circuit, a store operation is performed to transfer (copy) the data from the latch circuit to the nonvolatile-memory-cell MIS transistor. Whether the nonvolatile-memory-cell MIS transistor experiences a hot-carrier effect in the store operation depends on whether the data stored in the latch circuit is 0 or 1. A recall operation is subsequently performed to read the data stored in the nonvolatile-memory-cell MIS transistor. If the nonvolatile-memory-cell MIS transistor has experienced a hot-carrier effect in the store operation, an ON current smaller than the ON current of the reference MIS transistor is detected in the recall operation to flow through the nonvolatile-memory-cell MIS transistor. If the nonvolatile-memory-cell MIS transistor has not experienced a hot-carrier effect in the store operation, an ON current larger than the reference ON current is detected in the recall operation to flow through the nonvolatile-memory-cell MIS transistor. The latch circuit latches data that is either "0" or "1" depending on whether the ON current of the nonvolatile-memory-cell MIS transistor is larger or smaller than the reference ON current.

Since PermSRAM actively utilizes hot carriers having high-kinetic energy, impact ionization is likely to occur. In general, an electron having enough kinetic energy in a semiconductor material can knock a bound electron out of its bound state to create an electron-hole pair.

FIG. 1 is an illustrative drawing for explaining an effect of impact ionization. During a store operation in a PermSRAM, a drain 12 is set to a high potential such as 5 V, and a source 11 is set to a ground potential, for example. A gate 14 may be set to 1.8 V, which is half the voltage between the source node and drain node of the transistor that is subjected to a hot-carrier effect.

When hot electrons having high-kinetic energy flow as shown by an arrow A through the channel from the source to the drain, impact ionization occurs at the channel/drain injunction to create electron-hole pairs. The created holes flow in a substrate 10 as shown in an arrow B to generate an electric current running toward contacts which are fixed to an externally applied substrate potential. A voltage equal to a product of this electric current and the resistance of the substrate 10 appears between the source 11 and the externally applied substrate potential. This voltage serves to reduce the threshold voltage of the transistor and also the threshold voltages of neighboring transistors. There is thus a risk that the circuit does not function properly as designed.

Accordingly, there is a need for a nonvolatile memory cell that utilizes a hot-carrier effect for storage of data while suppressing an adverse effect caused by impact ionization.

SUMMARY OF THE INVENTION

It is a general object of the present invention to provide a memory circuit that substantially eliminates one or more problems caused by the limitations and disadvantages of the related art.

It is another and more specific object of at least one embodiment of the present invention to provide a memory circuit that can suppress an adverse effect caused by impact ionization.

According to one aspect, a memory circuit includes: a latch having a first node and a second node to store data such that a logic level of the first node is an inverse of a logic level of the second node, a MIS transistor having a gate node; a first source/drain node, and a second source/drain node, the first source/drain node coupled to the first node of the latch; and a control circuit configured to control the gate node and second source/drain node of the MIS transistor in a first operation such that a lingering change is created in transistor characteristics of the MIS transistor in response to the data stored in the latch; wherein the MIS transistor includes a highly-doped substrate layer, a lightly-doped substrate layer disposed on the highly-doped substrate layer, diffusion regions formed in the lightly-doped substrate layer, a gate electrode, sidewalls, and an oxide film.

According to another aspect, a memory circuit includes: a latch having a first node and a second node; a MIS transistor having a gate node, a first source/drain node, and a second source/drain node, the first source/drain node coupled to the first node of the latch, a current source coupled to the second node of the latch; and a control circuit configured to control the gate node and second source/drain node of the MIS transistor in a first operation such that a lingering change is created in transistor characteristics of the MIS transistor, and configured to control the gate node and second source/drain node of the MIS transistor in a second operation such that the latch compares electric currents between the MIS transistor and the current source to store data responsive to a presence or absence of the lingering change; wherein the MIS transistor includes a highly-doped substrate layer, a lightly-doped substrate layer disposed on the highly-doped substrate layer, diffusion regions formed in the lightly-doped substrate layer, a gate electrode, sidewalls, and an oxide film.

According to another aspect, a memory circuit includes: a MIS transistor whose transistor characteristics are adapted to experience a change by a hot-carrier effect; a current source; and a latch coupled to the MIS transistor and the current source to compare a current flowing through the MIS transistor with a current of the current source to store data responsive to a presence or absence of the change of the transistor characteristics; wherein the MIS transistor includes a highly-doped substrate layer, a lightly-doped substrate layer disposed on the highly-doped substrate layer, diffusion regions formed in the lightly-doped substrate layer, a gate electrode, sidewalls, and an oxide film.

According to at least one embodiment, the resistance of the highly-doped substrate layer is relatively low in comparison with the resistance of an ordinary substrate, so that a potential difference existing between the source of the MIS transistor and an externally applied substrate potential is suppressed. A reduction in the threshold voltage of the MIS transistor is thus decreased.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

The present invention is directed to PermSRAM. Namely, the memory cell transistors are MIS (metal-insulating film-semiconductor) transistors that have the same structure as ordinary MIS transistors used for conventional transistor functions (e.g., switching function). These memory cell transistors use neither a special structure such as a floating gate nor a special material such as a ferroelectric material or a ferromagnetic material. These MIS transistors are configured to selectively experience a hot-carrier effect on purpose for storage of one-bit data. The hot-carrier effect leaves an irreversible lingering change in the transistor characteristics to the MIS transistors. A change in the transistor characteristics caused by the hot-carrier effect achieves nonvolatile data retention.

In the following description, NMOS transistors are used as an example of the nonvolatile-memory-cell MIS transistors, but such examples are not intended to be limiting. PMOS transistors may as well be used as nonvolatile-memory-cell transistors.

In the following, embodiments of the present invention will be described with reference to the accompanying drawings.

Figure 2:
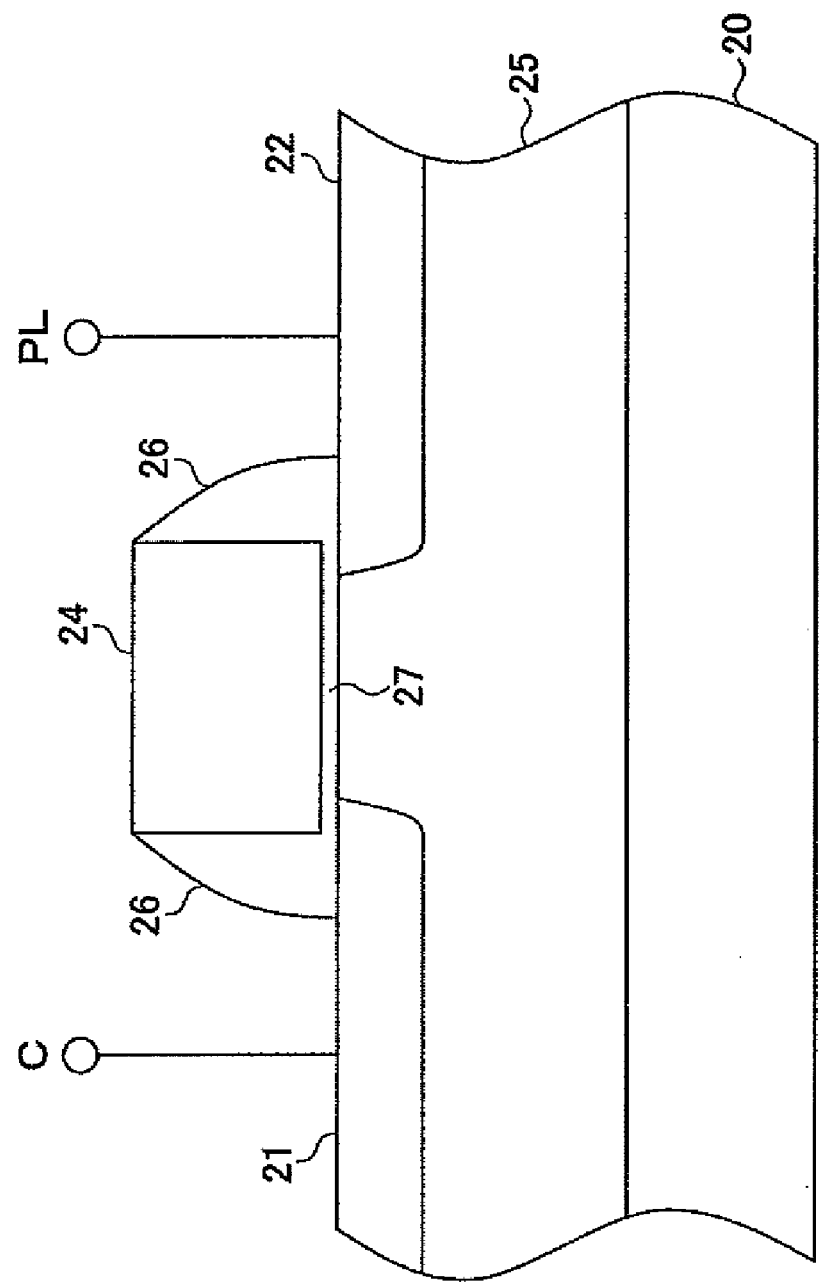
FIG. 2 is a cross-sectional view of a MIS transistor serving as a PermSRAM nonvolatile memory cell.

FIG. 2 is a cross-sectional view of a MIS transistor serving as a PermSRAM nonvolatile memory cell. A lightly-doped p-type epitaxial layer (lightly-doped p-type substrate layer) 25 is disposed on a highly-doped P-type substrate (highly-doped p-type substrate layer) 20. The highly-doped P-type substrate 20 has a higher impurity concentration than an impurity concentration for the lightly-doped p-type epitaxial layer 25. An N-type diffusion layer 21 and an N-type diffusion layer 22 are formed in the lightly-doped p-type epitaxial layer 25 to serve as the drain and source of a transistor. A gate electrode 24 is formed on the lightly-doped p-type epitaxial layer 25, with an insulating film such as an oxide film 27 intervening between the gate electrode 24 and the lightly-doped p-type epitaxial layer 25. Sidewalls 26 are disposed on the lateral faces of the gate electrode 24.

The N-type diffusion layer 21 may serve as a source, and the N-type diffusion layer 22 may serve as a drain. During a store operation (write operation) in a PermSRAM, the drain 22 is set to a high potential such as 5.0 V, and the source 21 is set to a ground potential, for example. The gate electrode 24 may be set to 1.8 V, which is approximately half the voltage between the source node and drain node of the transistor that is subjected to a hot-carrier effect. If this transistor is not subjected to a hot-carrier effect in the store operation, the drain 22, the source 21, and the gate electrode 24 may be set to 5.0 V, 1.8 V, and 1.8 V, respectively.

With a proper potential applied to the gate electrode 24, hot electrons having high-kinetic energy flow through the channel from the source 21 to the drain 22. Some of the hot electrons are trapped in the oxide film 27 and/or the sidewalls 26. The remaining hot electrons rush towards the drain 22, so that impact ionization occurs at the channel/drain junction to create electron-hole pairs. The created holes flow into the depth of the lightly-doped p-type epitaxial layer 25 and the highly-doped P-type substrate 20 to generate an electric current. The highly-doped P-type substrate 20 has at least one contact or back gate which is fixed to an externally applied substrate potential. Because the resistance of the highly-doped F-type substrate 20 is relatively low in comparison with the resistance of the substrate 10 shown in FIG. 1, a potential difference appearing in response to the above-noted current between the source 21 and the externally applied substrate potential is suppressed. As a result, a reduction in the threshold voltage of the transistor illustrated in FIG. 2 is decreased, and so are reductions in the threshold voltages of neighboring transistors. The circuit comprised of these transistors can thus function properly as designed.

Figure 1:
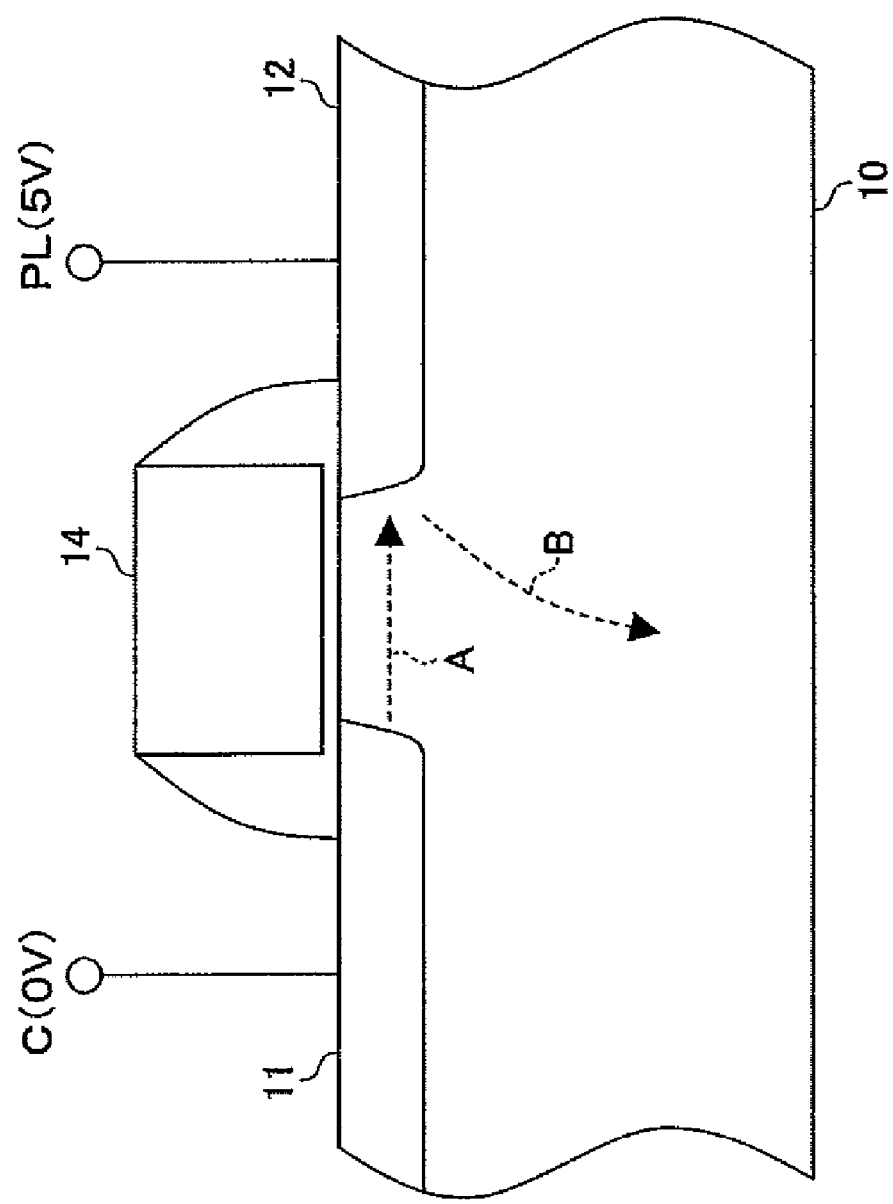
FIG. 1 is an illustrative drawing for explaining an effect of impact ionization.
Figure 3:
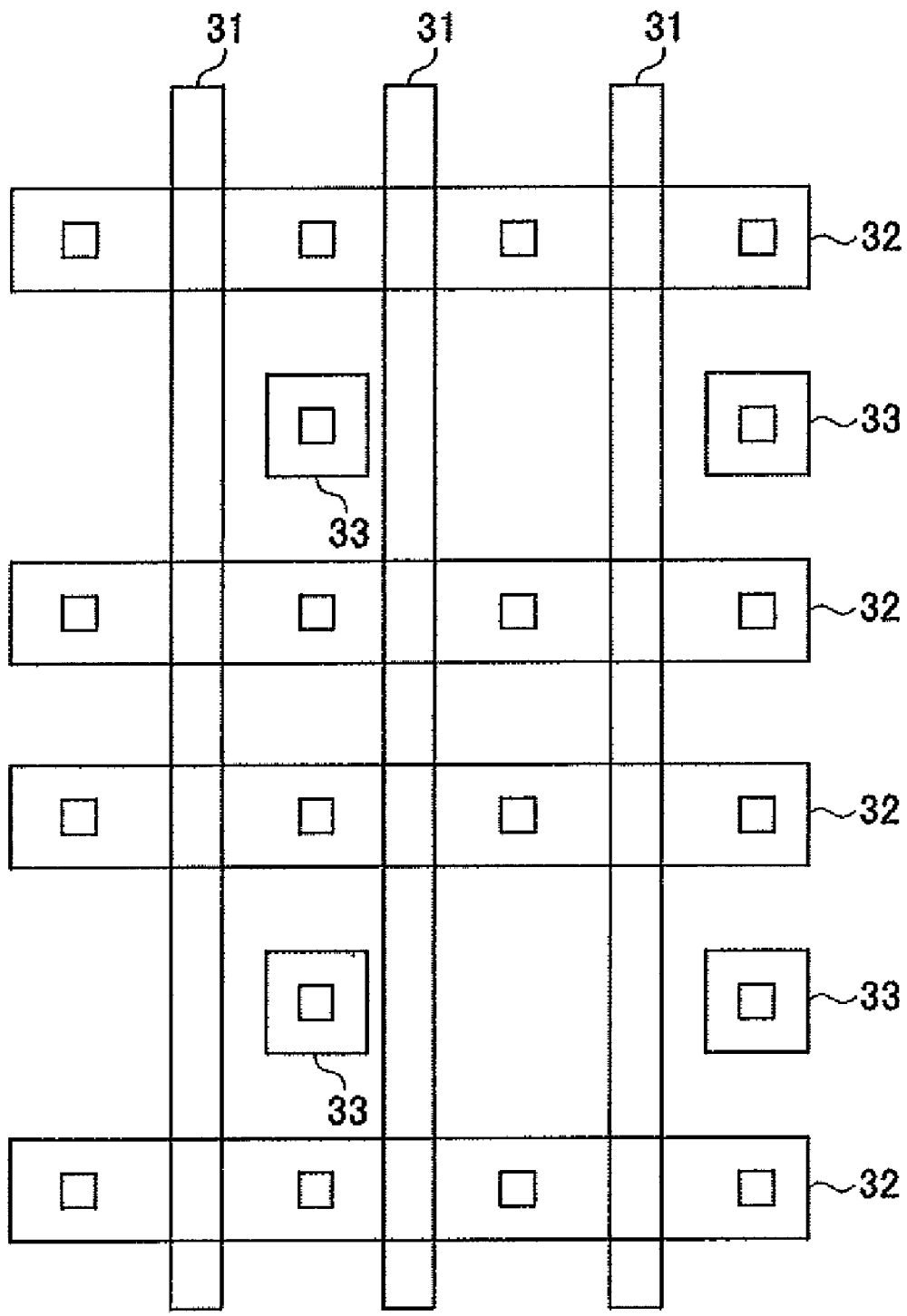
FIG. 3 is an illustrative drawing showing an example of the layout of transistors corresponding to the related-art device structure shown in FIG. 1.

FIG. 3 is an illustrative drawing showing an example of the layout of transistors corresponding to the related-art device structure shown in FIG. 1. In the related-art semiconductor device having the structure shown in FIG. 1, contacts 33 serving to fix a substrate potential to an externally applied potential need to be situated near diffusion regions 32 that form transistors with gate electrodes 31. As the substrate potential is properly set to the externally applied potential near the transistors, the circuit comprised of these transistors can function properly as designed. Because of the need for the provision of such contacts to ensure proper operations, the circuit suffers a reduction in circuit density.

Figure 4:
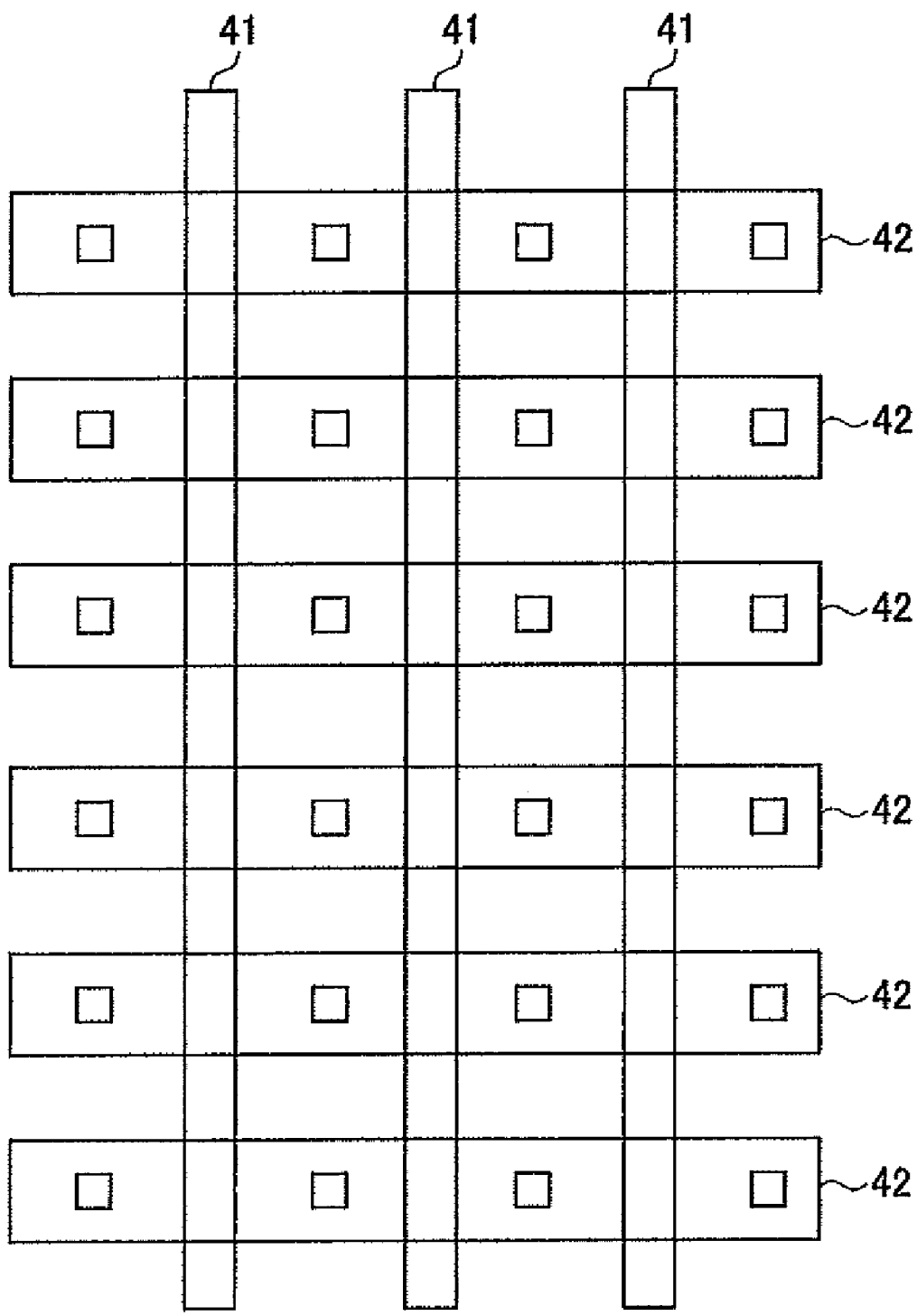
FIG. 4 is an illustrative drawing showing an example of the layout of transistors corresponding to the device structure shown in FIG. 2.

FIG. 4 is an illustrative drawing showing an example of the layout of transistors corresponding to the device structure shown in FIG. 2. In the semiconductor device having the structure shown in FIG. 2, there is no need to provide contacts near diffusion regions 42 that form transistors with gate electrodes 41. One or more contacts which are fixed to an externally applied substrate potential may be provided at a distance from the illustrated transistors in FIG. 4, yet can ensure the proper operation of these transistors. Alternatively, or in addition to such one or more contacts, a back gate formed on the back face of the highly-doped P-type substrate 20 may be fixed to an externally applied substrate potential to ensure the proper operation of these transistors. As the circuit comprised of these transistors can function properly as designed without the need for contacts in the vicinity of the transistors, circuit density can be increased from the removal of needless contacts.

Figure 5:
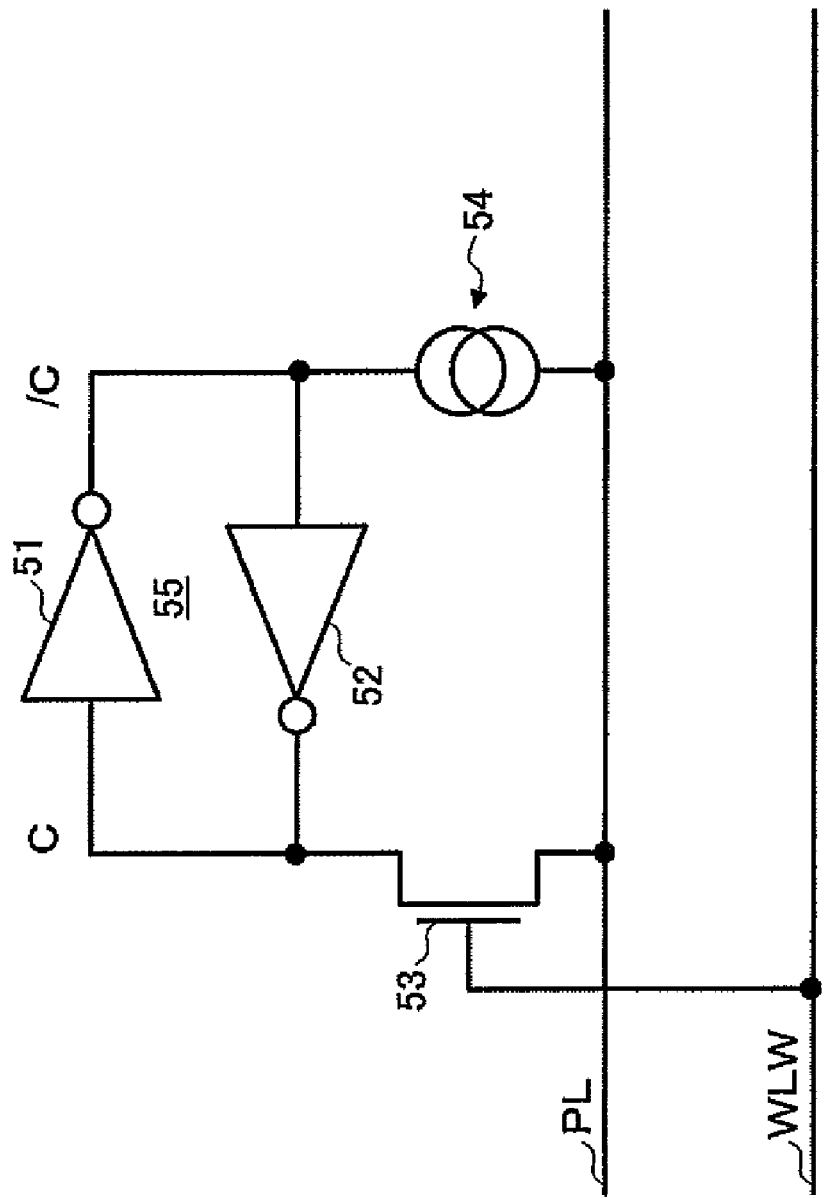
FIG. 5 is a circuit diagram showing an example of a memory circuit utilizing the nonvolatile-memory-cell MIS transistor shown in FIG. 2.

FIG. 5 is a circuit diagram showing an example of a memory circuit utilizing the nonvolatile-memory-cell MIS transistor as described above. A memory circuit shown in FIG. 5 includes an inverter 51, an inverter 52, an NMOS transistor 53, and a constant current source 54. The NMOS transistor 53 is a nonvolatile-memory-cell MIS transistor. The NMOS transistor 53 and the transistors constituting the inverters 51 and 52 are implemented on the lightly-doped p-type epitaxial layer 25 and the highly-doped P-type substrate 20, as shown in FIG. 2. As previously described, the use of the highly-doped P-type substrate 20 reduces an effect of impact ionization on the threshold voltage of the NMOS transistor 53. Namely, the threshold voltage of the NMOS transistor 53 is properly controlled by an intended hot-carrier effect, and is not adversely affected by impact ionization.

The gate node of the NMOS transistor 53 is coupled to a word selecting line WLW. One of the source/drain nodes of the NMOS transistor 53 is coupled to a plate line PL, and the other is coupled to an electrical node C. One end of the constant current source 54 is coupled to the plate line PL to supply an electric current to the plate line PL. The other end of the constant current source 54 is coupled to an electrical node /C (the symbol "/" preceding another symbol indicates an inverse of the latter symbol) to draw an electric current from the electrical node /C.

Each of the inverters 51 and 52 has the output thereof coupled to the input of one another, thereby forming a latch (flip-flop circuit) 55. The electrical node C and electrical node /C of the latch 55 have respective bi-stable potentials that are inverse to each other.

The NMOS transistor 53 is designed to operate with a power supply voltage of 1.8 V, for example. Namely, when this transistor is driven with a voltage no greater than 1.8 V, a change in the characteristics due to a hot-carrier effect does not occur from a practical point of view.

In a store operation (write operation), the electrical nodes C and /C of the latch 55 are set to respective potentials that are inverse to each other. For example, the electrical node C may be set to 0 V, and the electrical node /C may be set to 1.8 V. Such settings reflect the value of data stored in the latch 55, which may be supplied from an external source. During this operation, the constant current source 54 is kept inactive.

After the electrical nodes C and /C are set to the respective potentials as described above, the potential of the plate line PL is set to 5.0 V, for example. Further, the potential of the word selecting line WLW is set to 1.8 V, for example. The potential of the word selecting line WLW is determined such as to maximize the effect of a hot-carrier phenomenon. Generally, such potential is selected to be approximately half the voltage between the source node and drain node of the transistor that is subjected to a hot-carrier effect. At this point in time, the constant current source 54 still remains inactive, without allowing any passage of current.

When the potentials are set as described above, a voltage of 5.0 V between the plate line PL and the electrical node C is applied between the drain node and source node of the NMOS transistor 53. Because this bias voltage is larger than the voltage used in routine operations, the NMOS transistor 53 experiences a strong hot-carrier effect. Specifically, the application of the bias voltages for a duration of 1 millisecond to 10 millisecond serves to generate a change in the characteristics that is substantially larger than the normal variation of the transistor characteristics. For example, the threshold voltage of the NMOS transistor 53 rises a few hundreds of millivolts. In other words, the channel resistance increases approximately 10 times.

It should be noted that such a change in the transistor characteristics caused by a hot-carrier effect is localized around the drain node of the NMOS transistor 53, i.e., around the node of the NMOS transistor 53 that is coupled to the electrical node C.

If the potentials of the electrical nodes C and /C are reversed, with C being set to 1.8 V and /C being set to 0 V, the NMOS transistor 53 is placed in a nonconductive state, and, thus, does not experience a hot-carrier effect. There is no lingering change in the transistor characteristics of the NMOS transistor 53.

The hot-carrier effect as described above leaves an irreversible lingering change in the transistor characteristics. The presence or absence of change in the characteristics of the NMOS transistor 53 thus achieves a nonvolatile data retention that reflects the initial potential settings of the electrical nodes C and /C.

During the operation to store nonvolatile data as described above, the high potential (5.0 V) is never applied to the inverters 51 and 52. This is because the NMOS transistor 53 serves as intervening circuit elements between the plate line PL (5.0 V) and the node C. Since the word selecting line WLW is set to 1.8 V, and the node C serves as a source node, the potentials at the node C cannot exceed 1.8 V minus the threshold voltage.

In this configuration, therefore, a hot-carrier effect does not happen in the transistors used in the latch 55. All the MIS transistors used in the memory cell (i.e., the MIS transistor 53 serving as a memory cell transistor and the MIS transistors constituting the latch 55) may thus be properly designed to have the same structure with the same thickness of the gate oxide film.

In a recall operation (read operation) for recalling (reading) the data from the NMOS transistor 53, the latch 55 comprised of the inverters 51 and 52 is initially placed in an electrically inactive state, and is then shifted to an electrically active state. This may be achieved by shifting the power supply voltage VDD applied to the inverters 51 and 52 from 0 V to 1.8 V. The potentials of the word selecting line WLW and the plate line PL are set to 1.8 V and 0 V, respectively, before the latch 55 is activated. The constant current source 54 is active in this case thereby to provide a proper amount of reference current.

In a first case, the NMOS transistor 53 has a lingering change in the characteristics due to a hot-carrier effect (such as an increase in the threshold voltage or a decrease in the ON current). In this case, the force that pulls down the electrical node C is weaker than the force that pulls down the electrical node /C based on the reference current. After the activation of the latch 55, therefore, the electrical node C is set to the HIGH level, and the electrical node /C is set to the LOW level.

In a second case, the NMOS transistor 53 does not have a lingering change in the characteristics due to a hot-carrier effect. In this case, the force that pulls down the electrical node C is stronger than the force that pulls down the electrical node /C based on the reference current. After the activation of the latch 55, therefore, the electrical node C is set to the LOW level, and the electrical node /C is set to the HIGH level.

In this manner, the configuration shown in FIG. 5 can detect and sense the data stored through a hot-carrier effect. It should be noted, however, that the HIGH/LOW levels of the electrical nodes C and /C are reversed between when the data is written and when the data is read. Because of this, there is a need for a data reversal circuit to invert data at the time of data writing or at the time of data reading. Such a data reversal circuit will be described later.

The above description has been directed to a case in which the plate line PL is set to different potentials between the store operation and the recall operation. Alternatively, the plate line PL may be set to a fixed potential such as a ground potential during both the store operation and the recall operation. In such a case, the nodes C and /C need to be set to 5.0 V and 0 V (or 0 V and 5.5 V), respectively, to perform a store operation causing a hot-carrier effect. This arrangement is possible when the transistors constituting the inverters 51 and 52 have a thicker gate oxide film that ensures hot-carrier-effect-free transistor operations even at high potentials. When data is stored in this manner, data reversal as previously described does not occur, and, thus, there is no need to provide a data reversal circuit.

Figure 6:
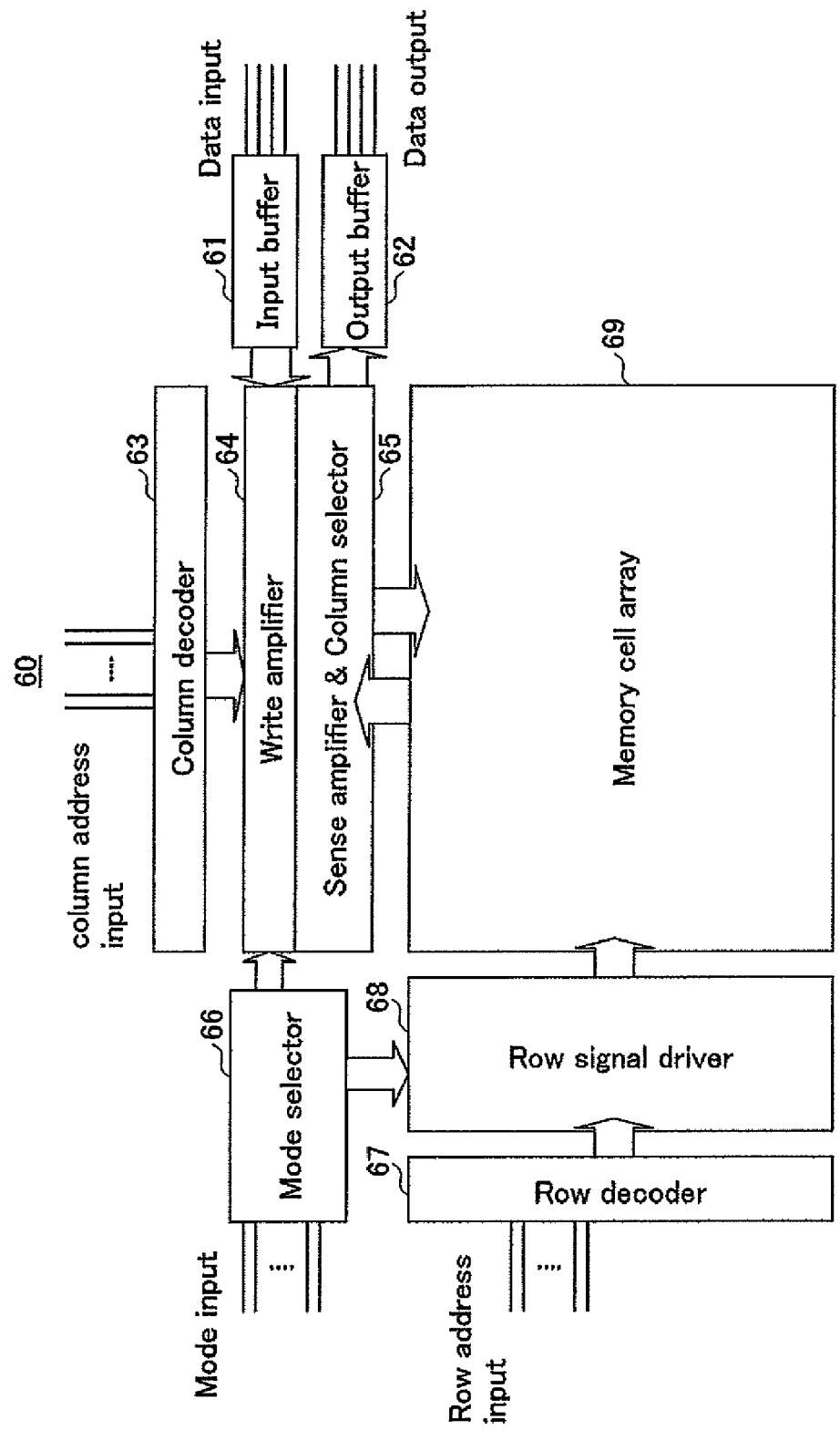
FIG. 6 is a block diagram showing the configuration of a nonvolatile semiconductor memory device.

FIG. 6 is a block diagram showing the configuration of a nonvolatile semiconductor memory device. A semiconductor memory device 60 shown in FIG. 6 includes an input buffer 61, an output buffer 62, a column decoder 63, a write amplifier 64, a sense amplifier & column selector 65, a mode selector 66, a row decoder 67, a row signal driver 68, and a memory cell array 69.

The memory cell array 69 includes a plurality of memory cells arranged in matrix form, each memory cell corresponding to the NMOS transistor 53 shown in FIG. 5. The memory cells arranged in the same column are connected to the same bit line, and the memory cells arranged in the same row are connected to the same word selecting line WLW.

The mode selector 66 receives mode input signals from an exterior of the device, and decodes the mode input signal to determine an operation mode (e.g., a write operation mode or a read operation mode). Control signals responsive to the determined operation mode are supplied to the write amplifier 64, the sense amplifier & column selector 65, the row signal driver 68, etc., for control of the individual parts of the semiconductor memory device 60.

The column decoder 63 receives a column address supplied from an external source situated outside the semiconductor memory device 60, and decodes the column address to determine a selected column. The decode signals indicative of the selected column are supplied to the write amplifier 64 and the sense amplifier & column selector 65.

The row decoder 67 receives a row address supplied from the external source, and decodes the row address to determine a selected row. The decode signals indicative of the selected row are supplied to the row signal driver 68.

In response to the control signals from the mode selector 66 and the decode signals from the row decoder 67, the row signal driver 68 activates a selected word selecting line and a selected plate line among the word selecting lines and plate lines extending from the row signal driver 68.

In response to the control signals from the mode selector 66 and the decode signals from the column decoder 63, the sense amplifier & column selector 65 couples a bit line corresponding to the selected column to a data bus. Through this coupling, data is transferred between the memory cell array 69 and the data bus. The sense amplifier & column selector 65 amplifies the data read from the memory cell array 69 for provision to the output buffer 62. The data is output from the output buffer 62 to outside the semiconductor memory device 60 as output data. Input data supplied to the input buffer 61 from an external source is provided to the write amplifier 64. The write amplifier 64 amplifies the input data to be written to the memory cell array 69.

Figure 7:
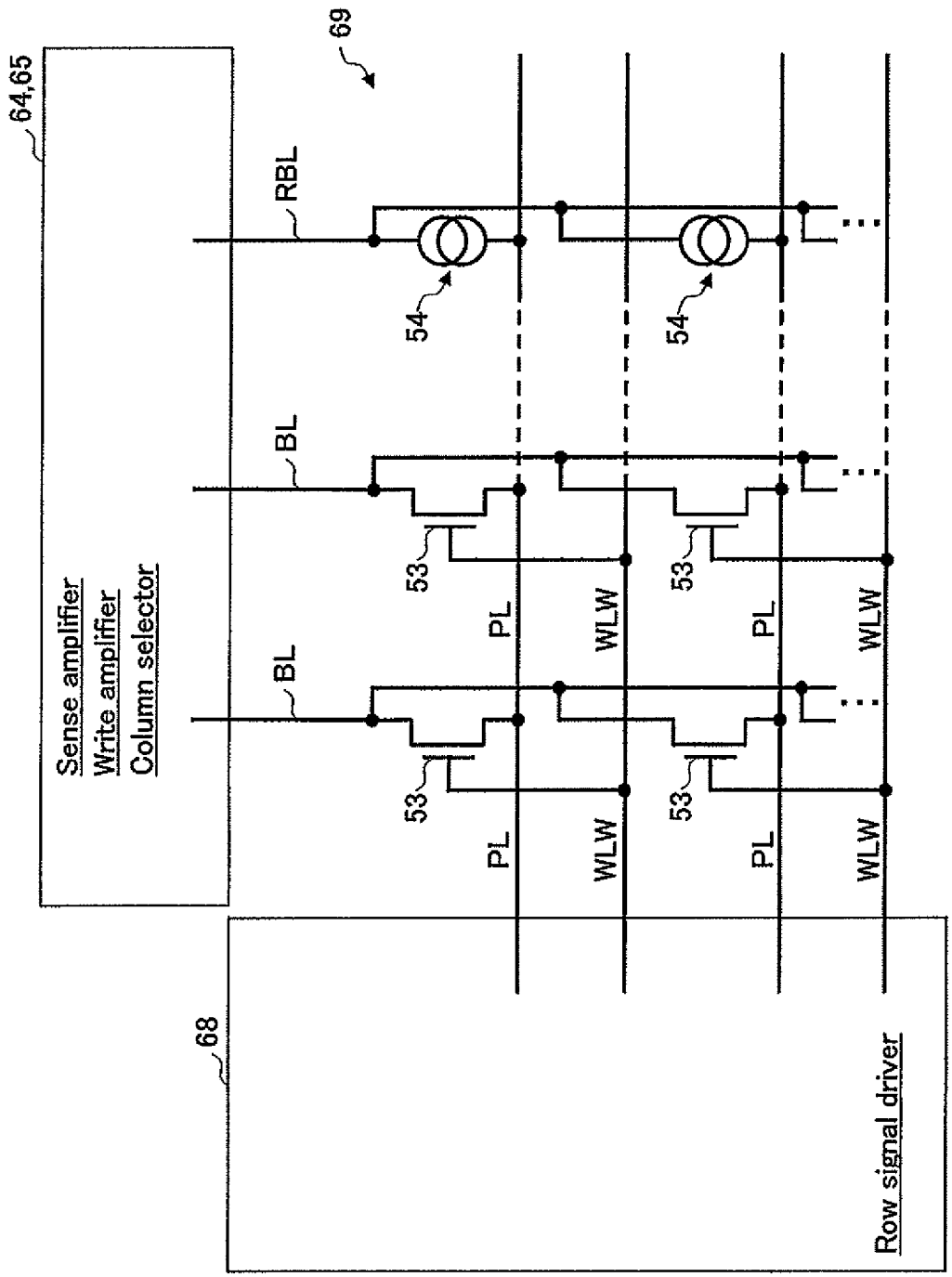
FIG. 7 is an illustrative drawing showing connections between memory cells and a write amplifier, a sense amplifier & column selector, and a row signal driver.

FIG. 7 is an illustrative drawing showing connections between memory cells and the write amplifier 64, the sense amplifier & column selector 65, and the row signal driver 68. In FIG. 7, the same elements as those of FIG. 5 and FIG. 6 are referred to by the same numerals, and a description thereof will be omitted.

As shown in FIG. 7, bit lines BL extend from the write amplifier 64 and the sense amplifier & column selector 65, and are coupled to the memory cells (i.e., the NMOS transistors 53). Further, a reference bit line RL extends from the write amplifier 64 and the sense amplifier & column selector 65, and is coupled to constant current sources 54. The word selecting lines WLW extend from the row signal driver 68 to be coupled to the gates of the NMOS transistors 53. The plate lines PL also extend from the row signal driver 68 to be connected to the source/drain of the NMOS transistors 53.

Latches, each corresponding to the latch 55 shown in FIG. 5, are provided in the write amplifier 64 and/or the sense amplifier & column selector 65. Both a write operation and a read operation may utilize a common latch 55. Alternatively, a latch 55 provided in the write amplifier 64 may be used when writing data to a NMOS transistor 53, and another latch 55 provided in the sense amplifier & column selector 65 may be used when reading data. Switching between these latches and the bit lines BL may be performed by transfer gates operating under the control of the mode selector 66.

As previously described, a data reversal circuit for inverting data at the time of data writing or at the time of data reading may be necessary. Such a data reversal circuit may be situated either in the write amplifier 64 to reverse data at the time of data writing or in the sense amplifier & column selector 65 to reverse data at the time of date reading. Such data reversal may be implemented simply by switching signal paths.

In the case of a data write operation, a selected bit line BL corresponding to a selected column carries write data supplied from an external source. The row signal driver 68 sets a selected word selecting line WLW to 1.8 V, and sets the remaining word selecting lines WLW to 0 V. Further, the row signal driver 68 sets a selected plate line PL to 5.0 V, and sets the remaining plate lines PL to 0 V. This causes the NMOS transistor 53 on the selected row at the selected column to experience a hot-carrier effect or not to experience a hot-carrier effect, depending on the value of the corresponding data bit carried on the selected bit line BL.

In the case of a data read operation, the row signal driver 68 sets a selected word selecting line WLW to 1.8 V, and sets the remaining word selecting line WLW to 0 V. All the plate lines PL are kept at 0 V in the data read operation. A selected bit line BL corresponding to a selected column is coupled to the latch 55 which may be provided in the sense amplifier & column selector 65. The reference bit line RBL is also coupled to this latch 55. The latch 55 senses the data stored in the NMOS transistor 53 on the selected row at the selected column. In this operation, provision may be made such that one of the constant current sources 54 on the selected row is set active while the remaining constant current sources 54 are set inactive. Alternatively, only one constant current source 54 may be provided, and may be used regardless of which row is selected.

The above description has been directed to a case in which a single bit corresponds to a single column. Alternatively, provision may be made such that a plurality of bits corresponds to a single column. In such a case, a plurality of bit lines may be coupled to respective latches 55, which may also be coupled to respective constant current sources 54. Each latch 55 thus senses data of a corresponding memory cell by use of a corresponding reference current.

Figure 8:
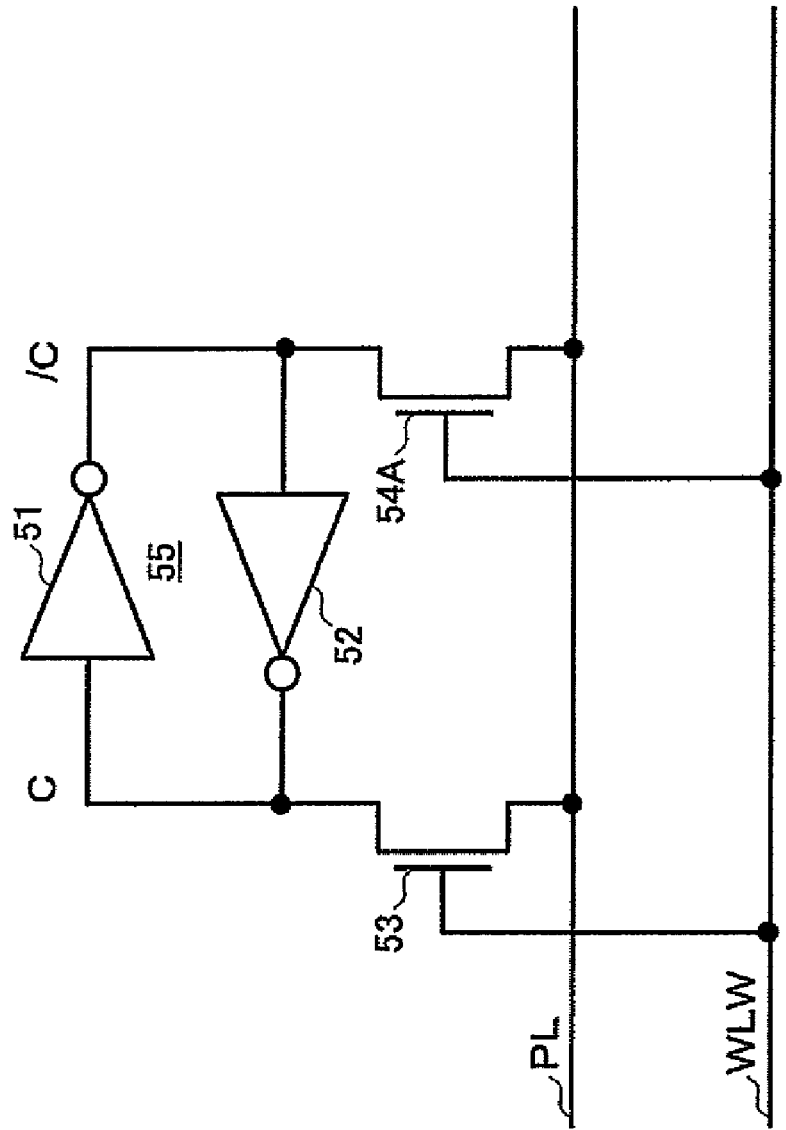
FIG. 8 is a circuit diagram showing an example of a constant current source.

FIG. 8 is a circuit diagram showing an example of a constant current source 54. In FIG. 8, the same elements as those of FIG. 5 are referred to by the same numerals, and a description thereof will be omitted. In this example, the constant current source 54 is implemented as an NMOS transistor 54A. The NMOS transistor 54A is a MIS transistor identical to the NMOS transistor 53.

Each memory cell may include the NMOS transistor 53 and the NMOS transistor 54A. For the purpose of nonvolatile data retention, one of the NMOS transistors 53 and 54A, whichever is selected according to the data stored in the latch 55, experiences a hot-carrier effect. In a store operation, the plate line PL is set to 5.5 V, and the word selecting line WLW is set to 1.8 V. If the nodes C and /C are set to 0 V and 1.8 V, respectively, a voltage of 5.0 V is applied across the NMOS transistor 53 in the store operation, while the NMOS transistor 54A is placed in a nonconductive state. In this case, only the NMOS transistor 53 experiences a hot-carrier effect, and the NMOS transistor 54A does not experience a hot-carrier effect.

If the potentials of the electrical nodes C and /C are reversed, with C being set to 1.8 V and /C being set to 0 V, the NMOS transistor 53 is placed in an nonconductive state, and, thus, does not experience a hot-carrier effect. On the other hand, the NMOS transistor 54A experiences a hot-carrier effect.

The hot-carrier effect as described above leaves an irreversible lingering change in the transistor characteristics. Changes in the characteristics of the NMOS transistor 53 and NMOS transistor 54A caused by the hot-carrier effect thus achieve a nonvolatile data retention that reflects the initial potential settings of the electrical nodes C and /C.

In a recall operation, the latch 55 comprised of the inverters 51 and 52 is initially placed in an electrically inactive state, and is then shifted to an electrically active state. The potentials of the word selecting line WLW and the plate line PL are set to 1.8 V and 0 V, respectively, before the latch 55 is activated.

In a first case, the NMOS transistor 53 has a lingering change in the characteristics due to a hot-carrier effect (such as an increase in the threshold voltage or a decrease in the ON current), whereas the NMOS transistor 54A does not have such a lingering change in the characteristics. In this case, the force that pulls down the electrical node C is weaker than the force that pulls down the electrical node /C. After the activation of the latch 55, therefore, the electrical node C is set to the HIGH level, and the electrical node /C is set to the LOW level.

In a second case, the NMOS transistor 54A has a lingering change in the characteristics due to a hot-carrier effect (such as an increase in the threshold voltage or a decrease in the ON current), whereas the NMOS transistor 53 does not have such a lingering change in the characteristics. In this case, the force that pulls down the electrical node C is stronger than the force that pulls down the electrical node /C. After the activation of the latch 55, therefore, the electrical node C is set to the LOW level, and the electrical node /C is set to the HIGH level.

In this manner, the configuration shown in FIG. 8 can detect and sense the data stored through a hot-carrier effect similar to the manner in which data is sensed in the configuration shown in FIG. 5. As previously described, there is again a need for a data reversal circuit to invert the data at the time of data writing or at the time of data reading.

Figure 9:
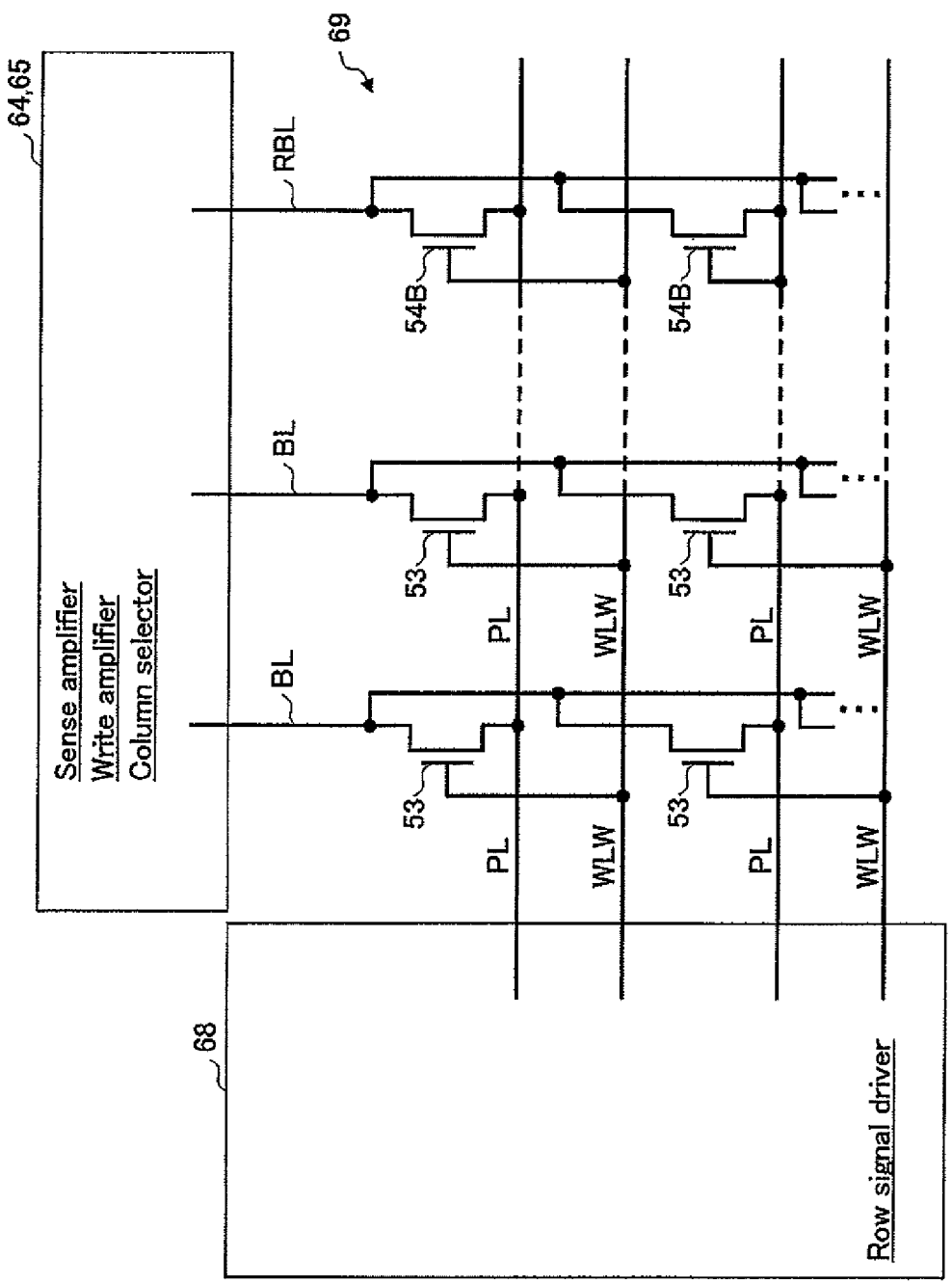
FIG. 9 is a drawing showing a configuration in which NMOS transistors serving as constant current sources are coupled to a reference bit line.

The above description has been directed to a case in which each memory cell includes the NMOS transistors 53 and 54A. Alternatively, each constant current source 54 shown in FIG. 7 may simply be implemented by use of an NMOS transistor. FIG. 9 is a drawing showing a configuration in which NMOS transistors serving as constant current sources are coupled to a reference bit line. In this configuration, an NMOS transistor 54B serving as a reference cell is provided for each row. The NMOS transistor 54B may be designed such that its ON current is smaller than the ON current of the NMOS transistor 53 having experienced no hot-carrier effect, and is larger than the ON current of the NMOS transistor 53 having experienced a hot-carrier effect. Further, the write amplifier 64 and sense amplifier & column selector 65 are designed such that the reference bit line RBL is disconnected from the latch 55 during a store operation. This ensures that the threshold voltages of the NMOS transistors 54B are not changed by a hot-carrier effect.

The gates of the NMOS transistors 54B are coupled to the respective word selecting lines WLW. When one of the word selecting lines WLW is set to 1.8 V while the remaining word selecting lines WLW are set to 0 V in a data read operation, only the NMOS transistor 54B on the selected row is made conductive. Alternatively, only one NMOS transistor 54B may be provided, and may be used regardless of which row is selected.

Figure 10:
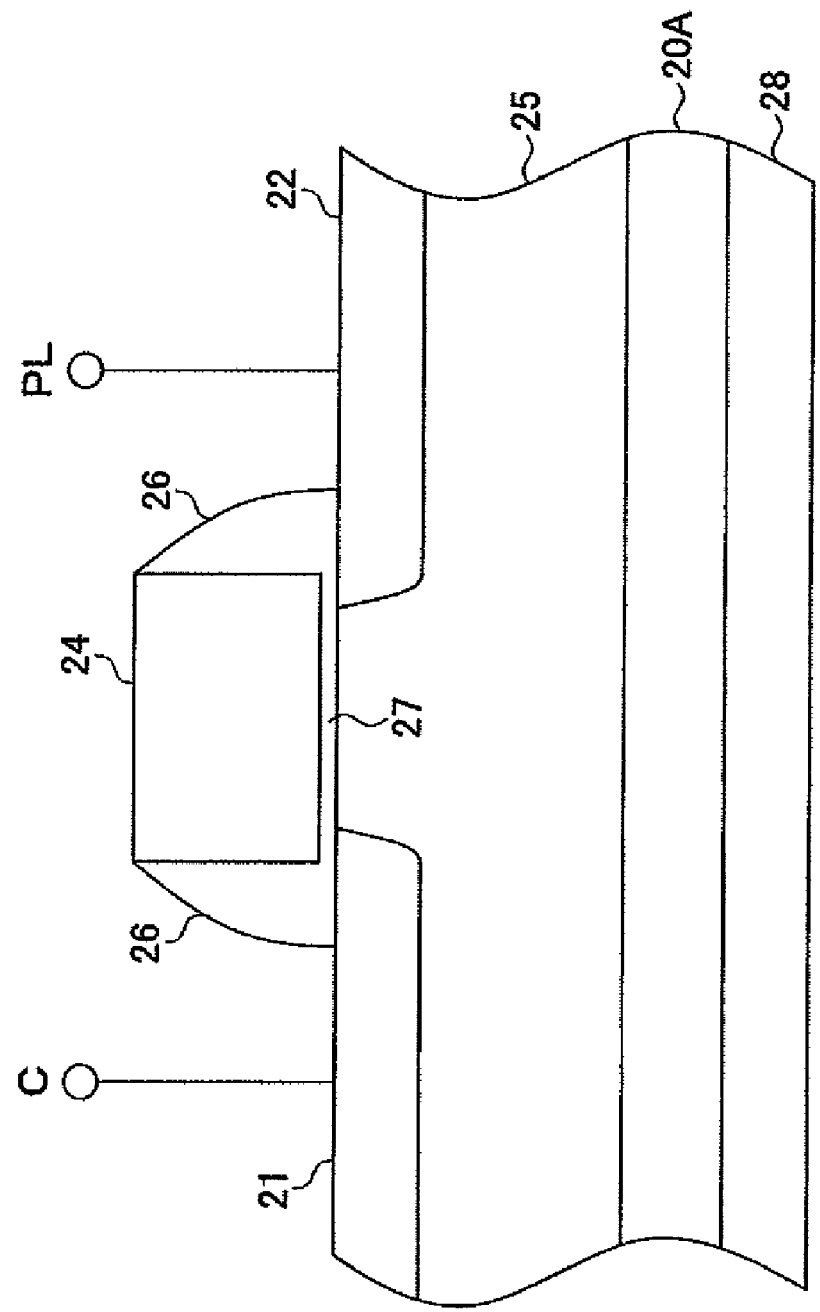
FIG. 10 is a drawing showing a variation of the MIS transistor serving as a PermSRAM nonvolatile memory cell.

FIG. 10 is a drawing showing a variation of the MIS transistor serving as a PermSRAM nonvolatile memory cell. In FIG. 10, the same elements as those of FIG. 2 are referred to by the same numerals, and a description thereof will be omitted.

In FIG. 10, a highly-doped P-type epitaxial layer 20A is disposed on a lightly-doped P-type substrate 28. The lightly-doped p-type epitaxial layer 25 is further disposed on the highly-doped P-type epitaxial layer 20A. The remaining configurations are identical to those shown in FIG. 2.

In the configuration shown in FIG. 2, a highly-doped Impurity (boron) is exposed at the back face of the substrate. Such boron may be transferred to a process apparatus during a manufacturing process, resulting in contamination of other semiconductor substrates. The provision of the lightly-doped P-type substrate 28 at the back face of the substrate shown in FIG. 10 can reduce the risk of creating such a contamination. Since the highly-doped P-type epitaxial layer 20A is embedded in the substrate structure, the resistance of the substrate is still as low as that of the configuration shown in FIG. 2. It should be noted that the highly-doped P-type epitaxial layer 20A shown in FIG. 2 need not necessarily be an epitaxial layer, but may alternatively be produced by ion implantation.

Further, the present invention is not limited to these embodiments, but various variations and modifications may be made without departing from the scope of the present invention.

What is claimed is:

1. A memory circuit, comprising:
a latch having a first node and a second node to store data such that a logic level of the first node is an inverse of a logic level of the second node;
a MIS transistor having a gate node, a first source/drain node, and a second source/drain node, the first source/drain node coupled to the first node of the latch; and
a control circuit configured to control the gate node and the second source/drain node of the MIS transistor in a first operation such that a lingering change is created in the transistor characteristics of the MIS transistor in response to the data stored in the latch,
wherein the MIS transistor includes:
a highly-doped substrate layer;
a lightly-doped substrate layer disposed on the highly-doped substrate layer;
diffusion regions formed in the lightly-doped substrate layer;
a gate electrode;
sidewalls; and
an insulating film.

2. The memory circuit as claimed in claim 1, wherein the lingering change is created by hot electrons trapped in at least one of the insulating film and the sidewalls.

3. The memory circuit as claimed in claim 1, wherein the MIS transistor further includes another lightly-doped substrate layer beneath the highly-doped substrate layer, said another lightly-doped substrate layer being exposed at a back face.

4. The memory circuit as claimed in claim 1, further comprising a current source coupled to the second node of the latch, wherein the control circuit is configured to control the gate node and the second source/drain node of the MIS transistor in a second operation such that the latch compares a current running through the MIS transistor with a current of the current source to store data responsive to a presence or absence of the lingering change in the transistor characteristics of the MIS transistor.

5. The memory circuit as claimed in claim 4, wherein the current source comprises a MIS transistor.

6. The memory circuit as claimed in claim 1, wherein the highly-doped substrate layer is coupled to an externally applied fixed potential.

7. A memory circuit, comprising:
a latch having a first node and a second node;
a MIS transistor having a gate node, a first source/drain node, and a second source/drain node, the first source/drain node coupled to the first node of the latch;
a current source coupled to the second node of the latch; and
a control circuit configured to control the gate node and the second source/drain node of the MIS transistor in a first operation such that a lingering change is created in the transistor characteristics of the MIS transistor, and configured to control the gate node and the second source/drain node of the MIS transistor in a second operation such that the latch compares electric currents between the MIS transistor and the current source to store data responsive to a presence or absence of the lingering change,
wherein the MIS transistor includes:
a highly-doped substrate layer;
a lightly-doped substrate layer disposed on the highly-doped substrate layer;
diffusion regions formed in the lightly-doped substrate layer;
a gate electrode;
sidewalls; and
an insulating film.

8. A memory circuit, comprising:
a MIS transistor whose transistor characteristics are adapted to experience a change by a hot-carrier effect;
a current source; and
a latch coupled to the MIS transistor and the current source to compare a current flowing through the MIS transistor with a current of the current source to store data responsive to a presence or absence of the change of the transistor characteristics,
wherein the MIS transistor includes:
a highly-doped substrate layer;
a lightly-doped substrate layer disposed on the highly-doped substrate layer;
diffusion regions formed in the lightly-doped substrate layer;
a gate electrode;
sidewalls; and
an insulating film.

* * * * *